(12) United States Patent
Jacobwitz et al.

(10) Patent No.: US 10,490,594 B2
(45) Date of Patent: Nov. 26, 2019

(54) INJECTION MOLDED MICROOPTICS

(71) Applicant: International Business Machines Corporation, Armonk, NY (US)

(72) Inventors: Lawrence Jacobwitz, Wappingers Falls, NY (US); Stephen Buchwalter, Hopewell Junction, NY (US); Casimer DeCusatis, Poughkeepsie, NY (US); Peter A. Gruber, Mohegan Lake, NY (US); Da-Yuan Shih, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 329 days.

(21) Appl. No.: 15/294,283

(22) Filed: Oct. 14, 2016

(65) Prior Publication Data

US 2017/0033153 A1 Feb. 2, 2017

Related U.S. Application Data

(60) Continuation of application No. 14/026,598, filed on Sep. 13, 2013, now Pat. No. 9,490,408, which is a
(Continued)

(51) Int. Cl.
*H01L 33/58* (2010.01)
*H01L 31/0232* (2014.01)
(Continued)

(52) U.S. Cl.
CPC .. *H01L 27/14685* (2013.01); *B29D 11/00365* (2013.01); *B29D 11/00461* (2013.01);
(Continued)

(58) Field of Classification Search
None
See application file for complete search history.

(56) References Cited

U.S. PATENT DOCUMENTS 5,198,189 A 3/1993 Booth et al.
5,682,215 A 10/1997 Nishihara et al.
(Continued)

FOREIGN PATENT DOCUMENTS

JP 59-040543 A1 3/1984
JP 06-055260 3/1994
WO WO 03041174 A1 5/2003

OTHER PUBLICATIONS

Lien et al., "Microspherical surfaces with predefined focal lengths fabricated using microfluidic capillaries", Applied Physics Letters, vol. 83, No. 26, Dec. 23, 2003, pp. 5563-5565.

*Primary Examiner* — Robert K Carpenter
(74) *Attorney, Agent, or Firm* — Scully, Scott, Murphy & Presser, P.C.; L. Jeffrey Kelly, Esq.

(57) ABSTRACT

A wafer-scale apparatus and method is described for the automation of forming, aligning and attaching two-dimensional arrays of microoptic elements on semiconductor and other image display devices, backplanes, optoelectronic boards, and integrated optical systems. In an ordered fabrication sequence, a mold plate comprised of optically designed cavities is formed by reactive ion etching or alternative processes, optionally coated with a release material layer and filled with optically specified materials by an automated fluid-injection and defect-inspection subsystem. Optical alignment fiducials guide the disclosed transfer and attachment processes to achieve specified tolerances between the microoptic elements and corresponding optoelectronic devices and circuits. The present invention applies to spectral filters, waveguides, fiber-optic mode-transformers, diffraction gratings, refractive lenses, diffractive lens/Fresnel zone plates, reflectors, and to combinations of elements and devices, including microelectromechanical systems (MEMS) and liquid crystal device (LCD) matrices
(Continued)

for adaptive, tunable elements. Preparation of interfacial layer properties and attachment process embodiments are taught.

10 Claims, 7 Drawing Sheets

Related U.S. Application Data division of application No. 12/140,676, filed on Jun. 17, 2008, now abandoned, which is a division of application No. 11/195,147, filed on Aug. 2, 2005, now Pat. No. 7,399,421.

(51) Int. Cl.
  H01L 27/146 (2006.01)
  B29D 11/00 (2006.01)
  B82Y 30/00 (2011.01)
  G02B 3/00 (2006.01)
  G02F 1/137 (2006.01)
  G02F 1/29 (2006.01)

(52) U.S. Cl.
  CPC ............ B82Y 30/00 (2013.01); G02B 3/0018 (2013.01); G02B 3/0056 (2013.01); G02F 1/137 (2013.01); G02F 1/29 (2013.01); H01L 27/14627 (2013.01); H01L 31/02327 (2013.01); H01L 33/58 (2013.01)

(56) References Cited

U.S. PATENT DOCUMENTS

| | | |
|---|---|---|
| 5,943,463 A | 8/1999 | Unuma et al. |
| 6,003,757 A | 12/1999 | Beaumont et al. |
| 6,030,199 A | 2/2000 | Tseng |
| 6,105,852 A | 8/2000 | Cordes et al. |
| 6,171,885 B1 | 1/2001 | Fan et al. |
| 6,231,333 B1 | 5/2001 | Gruber et al. |
| 6,332,569 B1 | 12/2001 | Cordes et al. |
| 6,424,786 B1 | 7/2002 | Beeson et al. |
| 6,527,158 B1 | 3/2003 | Brouillette et al. |
| 6,558,889 B1 | 5/2003 | Oishi et al. |
| 6,669,801 B2 | 12/2003 | Yoshimura et al. |
| 6,738,171 B1 | 5/2004 | Campbell |
| 6,781,762 B2 | 8/2004 | Ozawa |
| 6,909,554 B2 | 6/2005 | Liu et al. |
| 6,914,724 B2 | 7/2005 | Redmond |
| 7,009,772 B2 | 3/2006 | Hsiao et al. |
| 7,265,402 B2 | 9/2007 | Koyanagi |
| 7,295,375 B2 | 11/2007 | Jacobowitz et al. |
| 7,399,421 B2 | 7/2008 | Jacobowitz et al. |
| 9,490,408 B2 * | 11/2016 | Jacobowitz ...... B29D 11/00365 |
| 2001/0027842 A1 | 10/2001 | Curcio et al. |
| 2002/0027300 A1 | 3/2002 | Hartmann et al. |
| 2002/0104823 A1 | 8/2002 | Cunningham et al. |
| 2003/0214057 A1 | 11/2003 | Huang |
| 2004/0027680 A1 | 2/2004 | Ozawa |
| 2004/0079114 A1 | 4/2004 | Aitken et al. |
| 2004/0188497 A1 | 9/2004 | Gruber et al. |
| 2004/0214420 A1 | 10/2004 | Brouillette et al. |
| 2004/0264855 A1 | 12/2004 | Chen |
| 2005/0069246 A1 | 3/2005 | Kato et al. |
| 2005/0109823 A1 | 5/2005 | Gruber et al. |
| 2005/0263571 A1 | 12/2005 | Belanger et al. |
| 2006/0231591 A1 | 10/2006 | Gruber et al. |
| 2006/0289607 A1 | 12/2006 | Buchwalter et al. |
| 2008/0285136 A1 | 11/2008 | Jacobowitz et al. |
| 2014/0084314 A1 | 3/2014 | Jacobowitz et al. |

* cited by examiner

INJECTION MOLDED MICROOPTICS

CROSS REFERENCE TO RELATED APPLICATION

This application is a continuation of co-pending application Ser. No. 14/026,598, filed Sep. 13, 2013, which is a divisional application of application Ser. No. 12/140,676, filed Jun. 17, 2008, which is a divisional application of prior application Ser. No. 11/195,147, filed Aug. 2, 2005, now U.S. Pat. No. 7,399,421. The entire contents and disclosures of patent application Ser. Nos. 14/026,598, 12/140,676 and 11/195,147 are hereby incorporated herein by reference in their entireties.

This application is related to application Ser. No. 11/195,150, filed Aug. 2, 2005, for "Injection Molded Microlenses For Optical Interconnects," now U.S. Pat. No. 7,295,375, issued Nov. 13, 2007, the disclosure of which is herein incorporated by reference in its entirety.

BACKGROUND OF THE INVENTION

The present invention relates to a highly efficient wafer-scale microelectronic process for the fabrication of spectral filters, microoptics, optical waveguide arrays and their aligned attachment to optoelectronic semiconductor imaging devices, integrated photonic devices, image displays, optical fiber interconnection, optical backplanes, memory devices, and spectrochemical or biomedical analysis devices.

Synthetic reconstruction of color images in solid-state analog or digital video cameras is conventionally performed through a combination of an array of optical microlens and spectral filter structures and integrated circuit amplifier automatic gain control operations following a prescribed sequence of calibrations in an algorithm. Fabrication of a planar array of microlenses is conventionally performed by application of a photoresist on a topmost layer of planarized film formed over red, green, blue color filters. By successive processing steps of patterning, developing, etching, followed by thermal reflow, the resist forms approximate plano-convex or hemispherical microlenses. The rheologic properties of the resist will determine the radius of curvature of the microlens elements in the planar array. Coupled with the resist's index of refraction, the resulting microlens array will have a focal length and light-collection properties which may depart from desired optimum performance, including poor control of the fill-factor of the photodiodes in an array comprising the pixel plane. Optical design of the lens shape and refractive index is extremely limited by the necessity to use photoimageable materials with restricted thermal reflow characteristics.

It is difficult to achieve long focal length high radius of curvature and high refractive index microlens arrays in a single array-plane using conventional microlens forming and fabrication processes. U.S. Pat. No. 6,482,669 B1 summarizes a number of the drawbacks of known solutions in the Prior Art. It is further noted and particularly pointed out that the present invention enables high-volume manufacturing of aspheric microlenses arrays. In addition to the foregoing description of fabricating semiconductor color imagers for digital cameras, microlens arrays are also widely employed for high-resolution display monitors and for the coupling of optical waveguides in optical backplanes and optical fibers used in optical communications networks. Electrically addressable lens elements made of various liquid crystal materials are also used in lens assemblies with variable focal length and variable depth of field, or to adjust the image position to accommodate different viewing conditions. These active lens elements are on the order of tens of microns in thickness and can be switched at speeds greater than 85 MHz, enabling full spectrum color imaging without noticeable flicker.

Figure 1A:
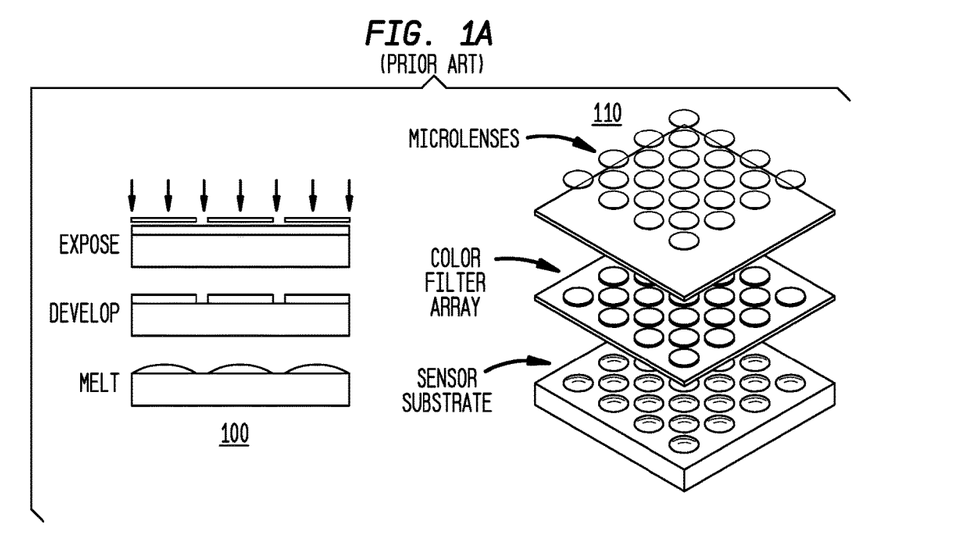
FIG. 1A illustrates a conventional semiconductor color imager device cross-section.
Figure 1B:
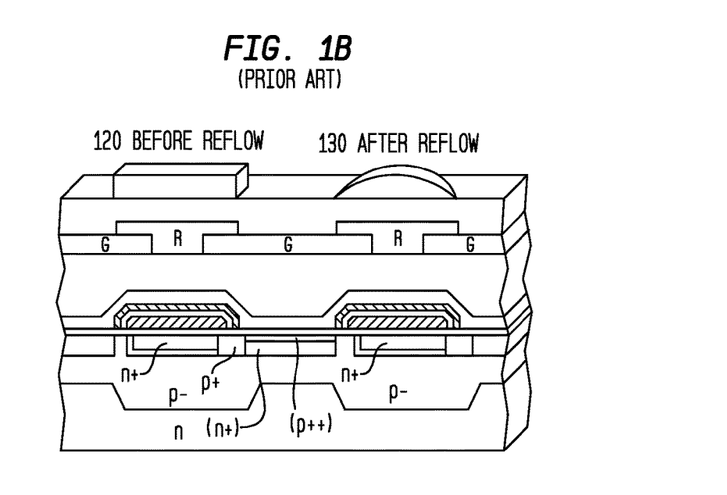
FIG. 1B depicts the Prior Art thermal reflow process of forming resist into microlenses.

FIG. 1A exhibits the Prior Art process 100 for the formation of a microlens array: a planar film of a photoimageable material such as a photoresist is photolithographically patterned such that exposure to actinic radiation and subsequent development of the photoresist forms a two-dimensional array of mesas which can be thermally reflowed (melted) into planoconvex microlenses under surface tension forces. An exploded assembly view is shown in 110, indicating the relative position and alignment of the microlens array elements to an underlying array of red, green, blue color filters and further underlying array of semiconductor photodetectors. By electronically amplifying and combining the outputs of the red, green and blue signals to comprise a unit of image or a picture element termed a pixel, color image formation is achieved. FIG. 1B is an isometric view showing the detailed semiconductor cross-section of the mesa-patterned photoresist 120 before reflow and the resulting planoconvex lens 130 after reflow. Topographical variations caused by the process of integrating color filters into the semiconductor, as shown in FIG. 1B, are a common problem in the Prior Art and typically require additional processing steps for adding a planarizing layer. The focal length required of the microlens elements is the vertical distance projected down to the photodetector array plane.

Figure 1C:
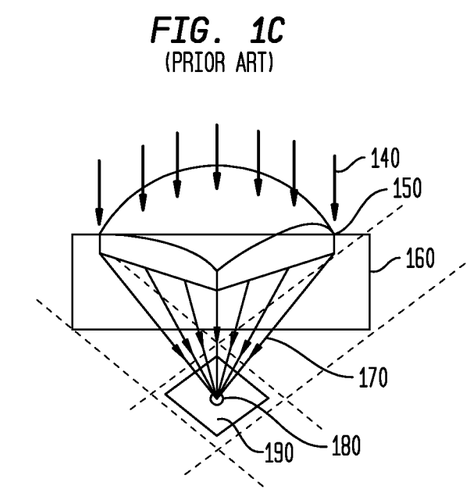
FIG. 1C pictures the light cone for image formation by microlenses onto the photodiodes.
Figure 1D:
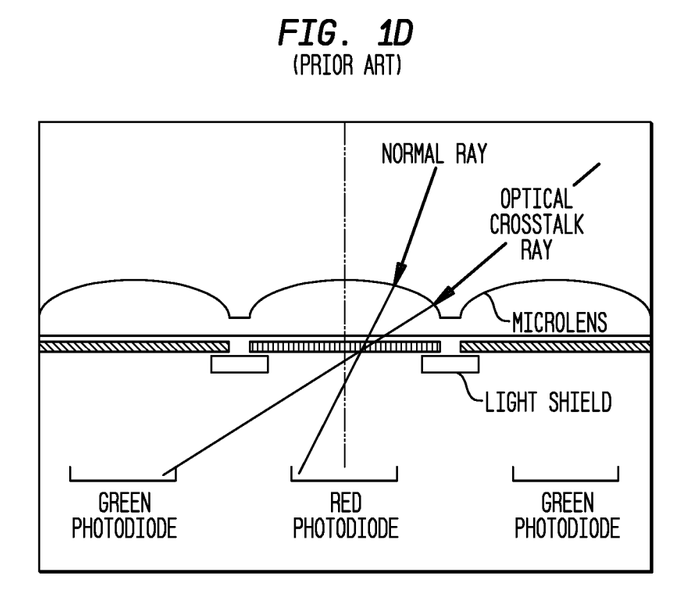
FIG. 1D exhibits the optics for color pixel formation with microlenses and color filters.

As the diameter of the approximately hemispherical microlens is reduced to accommodate increasing imager resolution and pixel density, the precursor photoresist film thickness scales down and the thermal reflow process of the prior art microlens formation process becomes limiting; the radius of curvature and refractive index of the reflowed lens cannot achieve the focal length requirement without significant cross-sectional thinning of the semiconductor device structure. FIG. 1C illustrates the case of collimated incident light 140 collected by planoconvex lens 150 converging a cone of light 170 passing through color filter 160 to focal plane 180 at photodetector 190. Optically generated cross-talk may result for off-axis incident image light, in spite of measures incorporating metal light shields formed between the color filters, when the optical properties of the microlens are limited by the thermal reflow process of the Prior Art, as demonstrated in FIG. 1D.

SUMMARY OF THE INVENTION

An object of the present invention is to teach an apparatus for high-volume wafer-scale manufacturing by injection molding of microoptic elements and microspectral filtering devices.

The conventional definition of a microlens is a lens with a diameter less than one millimeter. Generalizing this definition to the functional elements of optical systems designs, such as refractive or diffractive lenses, mirror/reflectors, Bragg gratings, interferometric devices like Mach-Zender interferometers, mode transformers for waveguide or fiber-optic couplers, variable or fixed optical attenuators, polarizers, compensators, rotators, splitters, combiners, and other devices, it is in accord with the above-mentioned object of the present invention to teach the extension of injection-molding technology down to the order of a micron.

Another object of the present invention is to provide processes for the wafer-scale fabrication of microoptic devices, which can be integrated into semiconductor structures, such as a color-imaging device for digital cameras. A further object of this invention is to extend this fabrication process to include liquid crystal materials which may be formed into active lens arrays with electronically variable focal length and depth of focus. In accord with another object of the present invention, there is provided a manufacturing method and microelectronic fabrication process sequence which minimizes the number and task-times of the operational unit-process steps required in the reduces of semiconductor arrays for color imaging devices. Production cost minimization is consistent with this latter object of the present invention.

A further object of the present invention is to teach the manufacturing of aspheric microlenses and lensfilter integration that are not possible with Prior Art technologies. A still further object of the present invention is to provide an apparatus and method for the lithographically precise alignment of arrays of microoptic elements to semiconductor structures, such as integrated color filter arrays and photodiode arrays, and, the attachment thereto.

Attachment of semiconductor chips to carriers, modules or packages using controlled collapse chip connection ("C4") technology has proven to provide superior electrical performance parameters, such as minimizing parasitics, mutual inductance, controlled impedance, and noise reduction. It is an object of the present invention to enable the concurrent use of the injection-molding apparatus for the hybrid use of solders for C4 joining of chips to substrates and for optical polymers or glasses for forming and attaching microoptic elements.

Additional molding features and additional uses for molded microoptic devices are described in U.S. Pat. No. 7,295,375 for "Injection Molded Microlenses For Parallel Optical Interconnects," issued Nov. 13, 2007, the disclosure of which is hereby incorporated herein by reference in its entirety.

DETAILED DESCRIPTION OF THE PREFERRED EMBODIMENTS

The present invention teaches an apparatus and method for the formation of planar arrays of microlenses and/or optical waveguides and photonic devices which may comprise, inter alia, optical bus I/O and memory structures in advanced future computer backplanes, image-formation layers on CMOS or CCD solid-state color imagers, matrix arrays of lenses on flat panel displays, and other fields of applications for microoptic elements.

Unlike conventional art, aspherics, anamorphics, cylindrical lenticular and ellipsoidal microoptic surface designs may be realized with the present invention to provide the long focal lengths required for semiconductor color imaging devices or for VCSEL (vertical cavity surface emitting laser) couplers, particularly those used in parallel optical links including applications such as InfiniB and channels for computers and storage devices. Employment of high refractive index materials, such as polymers, or glasses, or liquid crystal materials, with non-spherical shapes are enabled by the present invention. It is recognized and particularly pointed out that anisotropic etching processes to form cavities in mold plates, including reactive ion etching (RIE) or plasma etching, may be harnessed to create designed microoptics geometries by virtue of differential etch-rates along selected spatial directions, or, by virtue of preferential etching along crystallographic planes. Hence ellipsoidal or aspheric microlens shapes are generated through the controlled ratio of forward to lateral etch-rates in plasma or RIE chambers with defined gas components at specified partial pressures producing designed cavity shapes in a carrier mold plate or template.

Cavities with desired geometry can be created in a glass plate or other suitable carrier mold material such as polyimide to meet the requirement of various applications. Both wet etching and dry etching techniques have been widely used to etch cavities. The resolution of the wet etching technique is relatively poor due to its isotropic etching characteristics and the undercut it generates. In contrast, reactive ion etching (RIE) has the advantage of controlling the directionality and sidewall profile of the etched cavities. RIE offers good selectivity, little undercut, and high throughput. The process starts by first applying a blanket layer of etch mask material on the glass surface, then patterns it to have the mirror image of the device array on the wafer to which it will subsequently be transferred and attached. The etch mask can be a metal mask, polymer or combination of both. The glass plate is loaded in the RIE tool which generally consists of parallel plate electrodes and an rf power supply. The glass plate is placed on the electrode to which rf power is applied. The plasma of ionized gas is generated between the electrodes. A gas inlet introduces reactive gases, and a pumping system is used to maintain a constant pressure in the etching chamber. The pressures used in RIE are 1 to 20 Pa. Suitable etching gases, such as $CF_4$, $CF_3$, $C_2F_6$, $CHF_3$, $C_3F_6$, $CF_4+O_2$, $Cl_2F_2$, $CCl_4$, etc. can be selected so as to produce ionic species which react chemically with glass to form volatile products which spontaneously desorb from the etched glass surface and are removed by the vacuum pump system in the RIE tool. The sidewall profile can be controlled and optimized by parameters such as pressure and flow rate, rf power density (W/cm2), electrode design and the chemical nature of the discharge species.

Moldplates can also be fabricated by direct laser etching of the cavities. This process is particularly suitable for polyimides or polyimide-on-glass substrates.

A carrier mold plate with alignment marks and patterned, shaped cavities is designed to generate the microoptic array. Molten polymer or glass is injected to fill the mold plate. A conformal liner of PTFE or other release-film coats the surface of the mold cavities to enable detachment from the mold during transfer and attachment to various devices. Alternatively, plasma etch conditions may be controlled to effect a surface state on the injection mold's cavity walls which is hydrophobic or hydrophilic, thereby aiding the release of the molded microoptic elements. The mold plate coefficient of thermal expansion (CTE) is matched to the target wafer to which the injection molded optical components are bonded. An alternative embodiment employs a layer of polyimide which may either be laser ablated or photoexposed and developed into the array of cavities.

In order to facilitate release of the microlens material from the mold cavities, well known release agents can be used, including waxes and poly(tetrafluoroethylene) (PTFE) coatings. In addition, a class of materials is well known to form dense, highly ordered monolayer films on silica glass surfaces. These self-assembled monolayers, or SAM's, form because of the tendency of trisilanols to form a tight silyl ether network with silanol groups on the glass surface and with silanol groups on neighboring molecules. The self-ordering films come about from the close packing of long chain alkyl groups attached to the trisilanols. For example, when a wet glass surface is dipped into a dilute solution of octadecyltriethoxysilane or octadecyltrichlorosilane, a well ordered monolayer film assembles on the glass surface. Subsequent baking of the film makes a permanent bond of the film to the surface. Because the end group on the long chain alkyl can have a large number of different functional groups, SAM's allow tuning the surface energy of the glass mold to promote release of the microlenses to the wafer to which they are to be transferred. The SAM's are robust and will survive multiple reuses; and, moreover, when fouled they can easily be removed completely by oxygen ashing and a fresh SAM applied.

Figure 2:
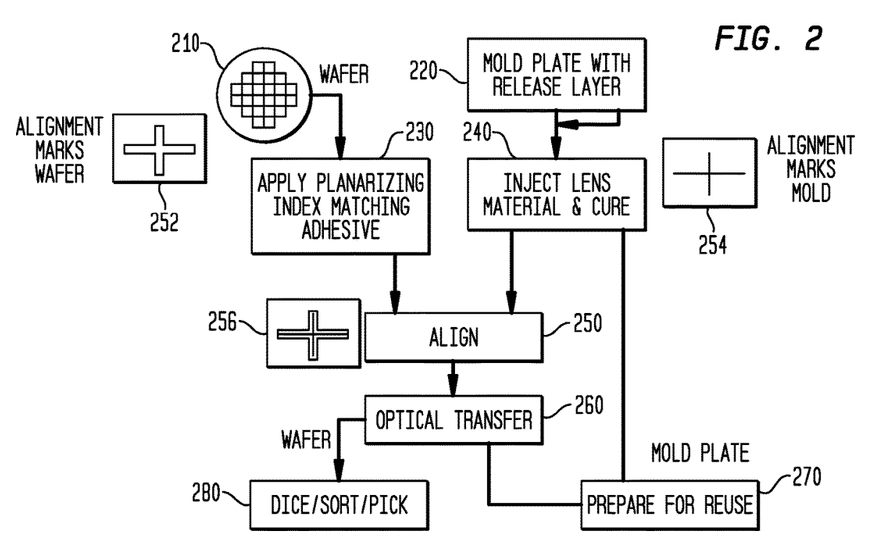
FIG. 2 is a simplified process flow chart describing the sequence and principal features of a preferred injection molded microoptics procedure.

FIG. 2 provides a process flow-chart description of one embodiment of the present invention. In FIG. 2, two parallel process sequences are shown, one for the filling and inspection of the cavities in a prepared mold plate, and, a second for the preparation of the wafer to be receiving the transferred elements from the cavities of the mold plate. The details of the apparatus design, alignment, transfer, optional reflow, and mold reuse cleaning processes are described in the set of FIGS. 2 through 7.

In FIG. 2, a wafer-scale mold plate 220 with photolithographically formed and etched optical alignment keys 254 and etched cavity array with cavity sidewalls coated with a release layer such as wax, PTFE, a SAM, or other suitable material or plasma process, is injected with a molten lens material 240. Wafer 210 with etched conjugate optical alignment keys 252 and an optional applied planarizing optical adhesive and refractive index matching layer 230 is brought into alignment by centering alignment key 254 inside key 252 as shown in the aligned state 256. The alignment process is performed by a conventional photoaligner tool 250. The microoptic elements formed in the cavities of the mold plate are transferred as shown in 260 to the interface layer 230. The wafer proceeds to dice, sort and pick 280 for final packaging of the finished device chip, while the mold plate is cleaned and prepared for multiple reuse 270.

The process flow details for the mold preparation and injection filling sequence are provided in FIG. 3 steps A,B,C,D. As previously described herein, a patterned array of cavities of designed shape are etched into mold plate 300 by one of the isotropic or anisotropic etch processes taught by the present invention. A conformal release layer 310 is applied to the array of cavities, the preferred composition of which may be selected from the group consisting of fluoropolymers such as PTFE (polytetrafluoroethylene), spray release agents based on wax or zinc oxide, a sacrificial laser ablatable layer or thermally decomposable layer using cavity heaters, self-assembled monolayers or SAMs, trichlorosilane, or other antistiction agents. A fill-tool, described in FIG. 4, injects dispensed liquid from the fill-head crucible into the array of cavities which will be solidified into microoptic or microspectral filter elements.

Figure 3A:
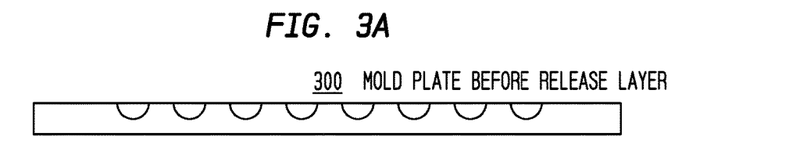
FIGS. 3A-3D indicate the process description for mold plate fill.
Figure 3B:
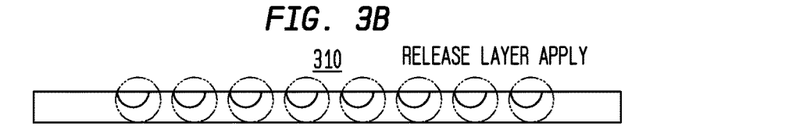
Figure 3C:
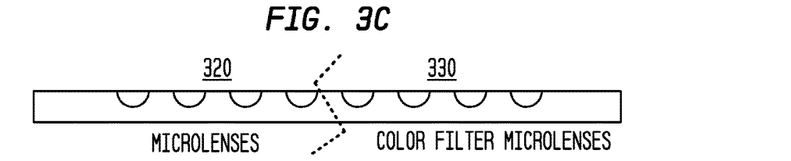
Figure 3D:
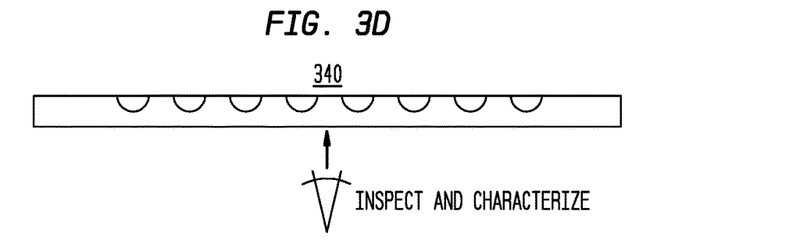

The preferred liquid materials for microlens arrays may be selected from the group consisting of polymers, photopolymers, glasses, sol-gels, UV-curable epoxies, resins, acrylics, cyclolefins, polycarbonates, PMMA (polymethyl methacrylate), polyimide, glass semiconductors such as $Ge_xSe_{1-x}$, and, combinations using photoinitiators and/or photoreactive agents. Two optional process sequences may next be followed: a first sequence, illustrated in FIG. 3 step C as transmissive microlenses 320, or a second sequence shown in FIG. 3 step C as spectrally absorptive microlenses which are defined in the present invention by the new term color filterlenses 330, or simply filterlenses 330. The filterlenses 330 are taught in the present invention to be the integration of the microlens array with the appropriate red, green and blue array of color filters. The lensfilter represents the combination of a red, green or blue dye-loaded or other color absorbing filter device into the optical polymer or glass comprising the microlens.

It is recognized and particularly pointed out that extrapolation of the lensfilter concept to other microoptic combinations of image-formation and spectral selection characteristics is subsumed in the present invention, and, that the apparatus and methods taught enable advances in the integration and wafer-scale manufacturing of microoptic products.

The advantage of parallel processing injection mold microoptics in carrier mold plates concurrently with that of other substrates, such as semiconductor device fabrication (e.g., image sensors or VCSEL wafers), is an important distinction from Prior Art. In particular, microoptics for VCSEL applications require unique characteristics which can more easily be fabricated using injection molding; these include fabrication of interconnected lens arrays which compensate for VCSEL array tolerance runout, compensation for the mismatch between a VCSEL divergence angle (typically 15-20 degrees) and the numerical aperture of an optical fiber or waveguide (which can be as low as 6 degrees) without violating international laser eye safety conditions (such as IEC 825). Accurate formation of the microlens surface is crucial, since due to their size, microlens elements cannot be optically polished using conventional means; the injection molding technique greatly facilitates this aspect of microlens fabrication.

A further important distinction is the independent inspection and characterization 340 made possible, as shown in FIG. 3 step D, wherein such spectral measurements as transmission spectrophotometry may be utilized for process and product Quality Control against color filter specifications or microlens focal length. The nature of the transparent glass mold enables blank subtraction of the glass transmission spectrum and optimization of dye-loading, film-thickness, microlens cavity depth and shape, and, determines whether rework is required before the microlens array and/or color filter array is committed to the product wafer. In a similar manner, microlens arrays used for VCSEL applications may enable wafer-scale alignment and test of the microlens/VCSEL combinations, wherein the characterization of VCSEL spectral measurements, optical power, and other features may be utilized for product quality control against the VCSEL specifications. If rework is needed, the mold plate is cleaned and prepared as detailed in the process flow chart provided in FIG. 2. It is also noteworthy that the mold plates can be prepared, filled and characterized against product engineering specifications to build to stock an inventory of parallel processed components, and, concurrently, wafers may similarly be prepared to stock devices which can be finished in manufacturing in a make-to-order operations management model. Consequently, product engineering changes and upgrades at minimum cost are enabled by the present invention.

Figure 4A:
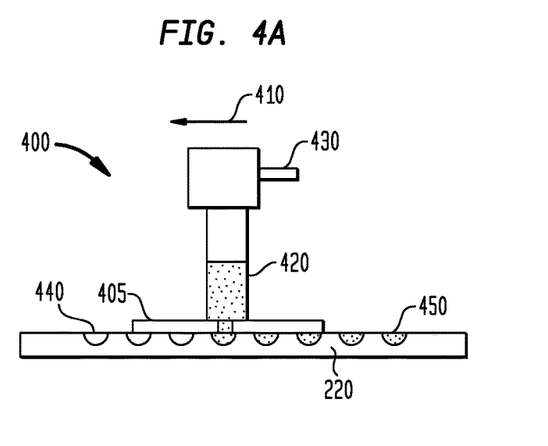
FIGS. 4A AND 4B are views of the mold plate fill tool scanning injection process.
Figure 4B:
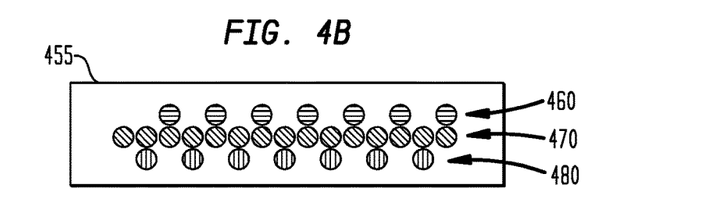

FIG. 4 is a schematic representation of the mold plate Fill Tool 400, comprised of a crucible containing either transmissive molten microlens material 420 for case A, or absorptive color lensfilter material for case B. Either the platen on which the mold plate resides or the dispensing, injection head may be translated relative to the other. Illustrated in FIG. 4, the Fill-Tool head is selected to be scanned as in 410 relative to the mold plate. A small positive pressure 430 drives fluid flow injection through fill blade 405 to fill a mold plate with cavities 220; unfilled cavities 440 ahead of the scan head, and, filled cavities 450 behind the scan head are shown. For the integration of microlens and color filter arrays, lensfilters of green, blue and red are fabricated using fill blade 455 which teaches a configuration for the single-step transfer of lensfilters to a receiving substrate. For CMOS or CCD color imagers the substrate is silicon, and for flat panel displays the substrate may be a glass or polymer plate. For VCSELs, the substrate will be a III-V based semiconductor wafer. The color fill blade 455 is seen to be comprised of a unique configuration of 3 rows, a first blue inject row 460, a second green inject row 470, and a third red inject row 480.

An alternative embodiment employing the standard fill blade 405 is as follows. Dye-loaded photocurable prepolymers are prepared as red, green and blue fluids and placed in separate crucibles. In a first scan of the fill head, all mold plate cavities are filled by dispensing and injecting the green fluid. A map of the red, green and blue color filter positions in a color imager array is used to selectively expose and photocure the corresponding mold plate cavities for green lensfilters. The remaining cavities are emptied and flushed. All green color filter positions remain in the form of green lensfilters. Again using the design map of color imager filter positions, a second scan dispenses and injects blue fluid into all unfilled cavity positions in the mold plate. Selective exposure cross-links and hardens the blue lensfilters in their cavities, and, all remaining uncured cavities are emptied and flushed. A third scan of the fill head dispenses and injects red fluid in the empty cavities and is cured. Spectrophotometric characterization of the filled template at appropriate stages assures in-spec manufacturing of the color lensfilters, unlike Prior Art processes which are testable only when the product has been completed. The color lensfilters are therefore known good lensfilters before committing them to the transfer to a product substrate; lensfilters are transferred to a color image sensor wafer only when the template is perfect. Significant increase in final product yield and cost reduction results.

While the process for injection molding of microlenses and of color filters has been taught for the independent cases of fabricating microlenses or integrating color filters with microlenses, it is recognized and particularly pointed out that the independent fabrication of color filters alone is also enabled by the present invention.

Advantages for molding microlenses include superior shape control, since the microlens elements are shaped by cavities not by surface tension. Laser etching to optical design specifications can be used to augment RIE, plasma or acid wet etched templates. Since the templates are transparent, lenses and spectral filters can be optically characterized in situ in the template. High multiples of reuse of the templates correlate well with lower cost than photolithographic on-wafer processing, resulting in yield improvements by inspection prior to transfer. Single layer arrays of aspheric microlenses provide the equivalence of compound spherical lenses requiring multilayering, with the attendant advantage of a thinner image sensor cross-sectional stack. Thinner image sensors are in turn very desirable for reducing product packaging dimensions. The current industry trend to higher resolution color imagers will similarly benefit from chromatic aberration corrections and color filter compensation for wavelength-dependent index of refraction variations inherent in the red, green, blue color filters of Prior Art.

Figure 5:
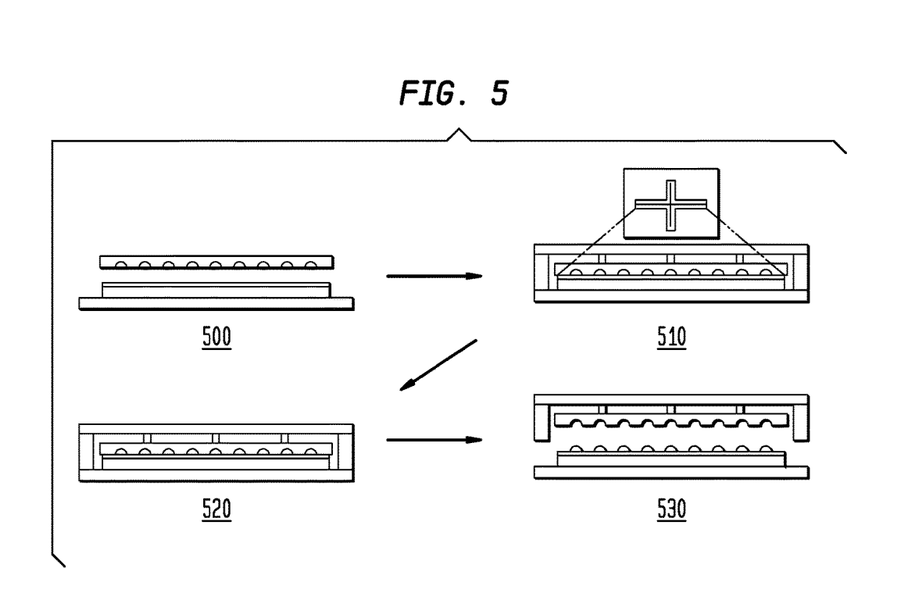
FIG. 5 depicts the process sequence for alignment, clamp, transfer, and attachment of microlenses.

The transfer process sequence for injection molded microoptics is given in FIG. 5. An Alignment-Tool using conventional photolithographic alignment keys aligns the filled template to a substrate such as a silicon CMOS color imager, as shown at 500. The aligned pair is clamped at 510, the cavity contents transferred, optionally assisted by an ultrasonic or gas pressure agent, and, separated at 530.

Figure 6:
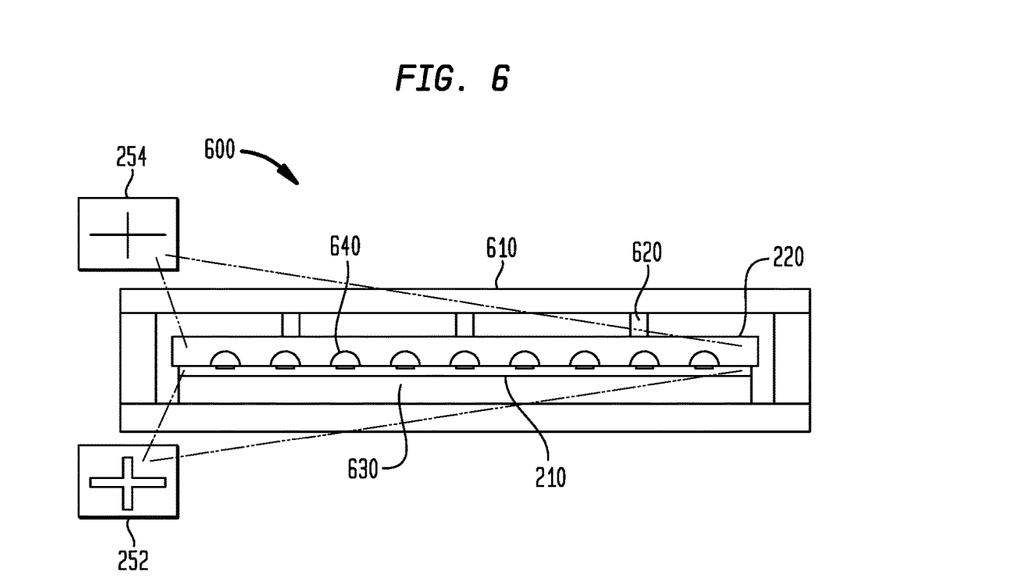
FIG. 6 provides a side view of the fixture frame for mold to wafer alignment and transfer.

FIG. 6 is a sideview of the mold-to-wafer transfer apparatus 600. Alignment key 254 on mold plate 220 is centered in alignment key 252 on wafer 210 supported on base 630 and contact points 620 inside fixture frame 610. Molded microlenses 640 are shown in alignment and in contact with the interface layer 800 shown in FIG. 8.

Figure 7:
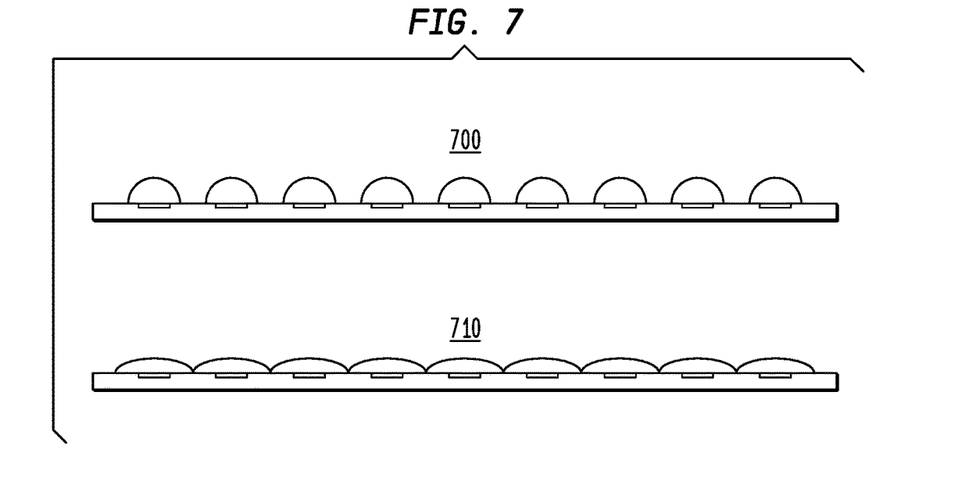
FIG. 7 illustrates the optional post-transfer thermal adjustment of a microlens array.

After the injection molded microoptic array has been transferred to the receiving device surface, an optional thermal reflow adjustment is shown in FIG. 7 to provide a process for modifying the lens shape and spacing as molded and transferred 700 to a configuration in which the lenses are contiguous 710, touching at their edges to eliminate gaps. An additional optional step can be added to provide a post-transfer irradiation for index of refraction tuning of the microlenses or an absorbance tuning of the color filters.

Figure 8:
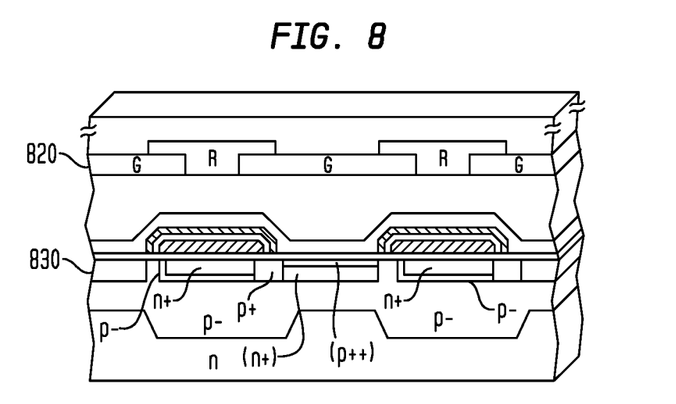
FIG. 8 indicates the wafer preparation process description for a microlens interface layer.

FIG. 8 illustrates the wafer preparation for the interface layer 800 which provides planarization, refractive-index matching to minimize interfacial reflection loss, and adhesion of the transferred microoptic array. Also shown is the alignment of color filter layer 820 to photodetector array 830 integrated in the silicon wafer 810.

Figure 9:
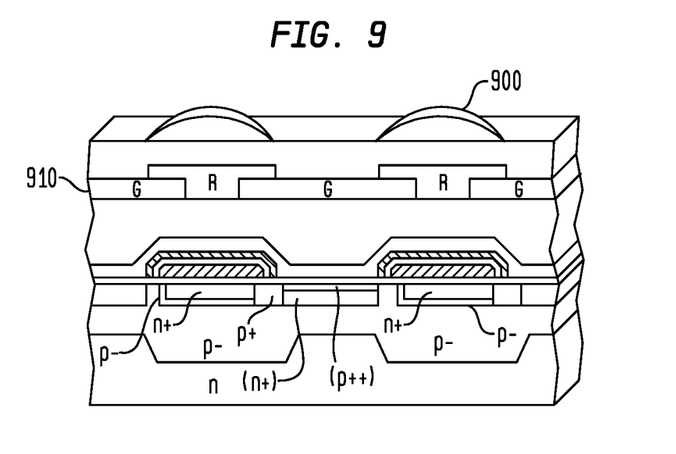
FIG. 9 is a prior art imager cross-section showing alignment of lens, filter and photodiode.
Figure 10:
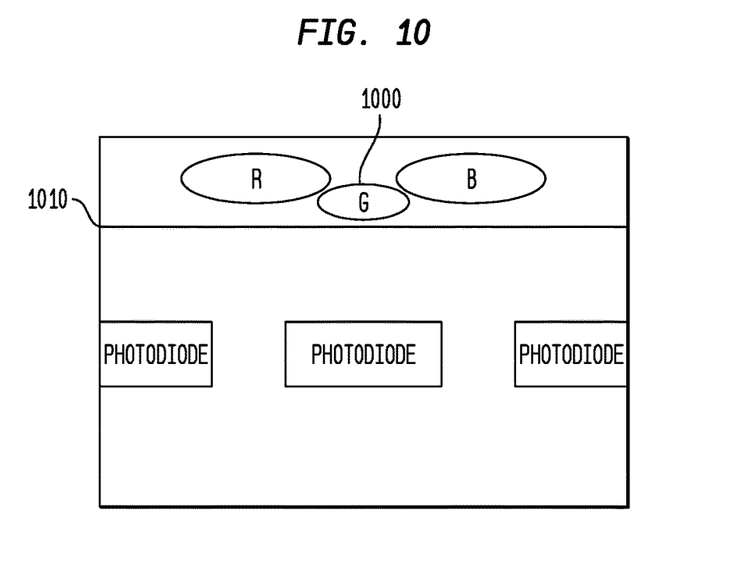
FIG. 10 shows the integrated red, green and blue color lensfilters of the present invention.

A semiconductor color imager cross-section is given in FIG. 9, depicting the aligned positions of the microlens array elements 900 above the color filters 910 and pn photodiodes. The advanced integration of the color filters and microlenses into the color lensfilters 1000 on interface layer 1010 is taught in the present invention as shown in FIG. 10.

Figure 11:
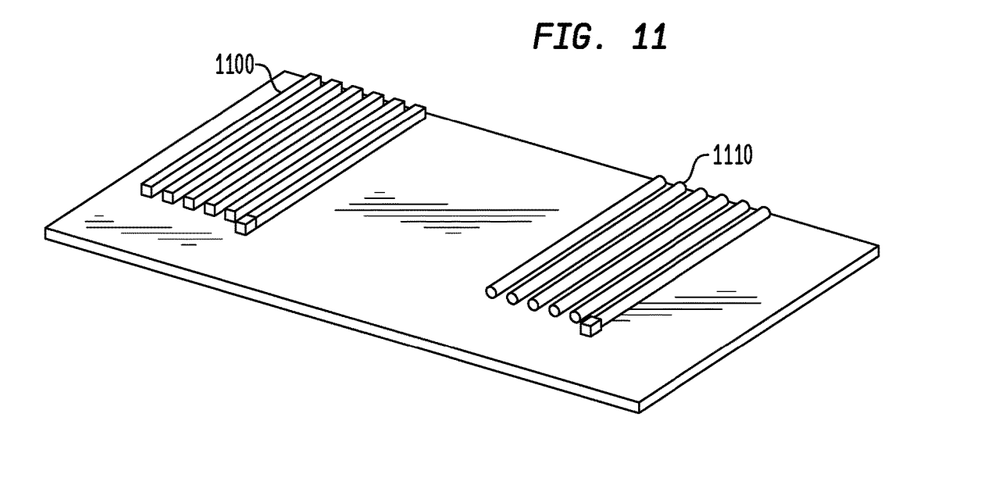
FIG. 11 illustrates an optical assembly for parallel waveguides or fiber-optic interconnects.

While one application for microoptic injection molding has been illustrated for solid-state color imaging devices, FIG. 11 exhibits the utility of molding optical assemblies for laser transmitters and receivers in parallel optical interconnects with waveguides or optical fibers, and shows two examples, one for hemicylindrical fibers or waveguides 1110 and square or rectangular fibers or waveguides 1100.

Most applications for microlenses or other optical coupling elements will also require electrical interconnects as well, if only for connecting power. Procedures are known for the injection molding of solder bumps onto silicon wafers, and it will be advantageous to have a hybrid process to use injection molding for both optical coupling elements as well as solder electrical interconnects. In this process, the microlenses are fabricated on the wafer as already described. Then a second mold is aligned to the wafer. This second mold has two different sets of cavities. The lower set of cavities is slightly larger than the microlenses to allow the mold to be placed in close contact with the wafer without contacting or damaging the microlenses. The second set of cavities is cylindrical through-holes in the glass mold to allow molten solder to be dispensed through the mold onto the wafers. After cooling, the second mold is separated from the wafer; leaving solder interconnects at the appropriate sites for making electrical contacts when the chips are assembled to the packaging substrates.

Additional molding features and additional uses for molded microoptic devices are described in U.S. Pat. No. 7,295,375 for "Injection Molded Microlenses For Parallel Optical Interconnects," issued Nov. 13, 2007, the disclosure of which is hereby incorporated herein by reference in its entirety.

While the invention has been particularly shown and described with reference to the preferred embodiments thereof, it will be understood by those skilled in the art that various changes in form and details may be made without departing from the spirit and scope of the present invention.

What is claimed is:

1. A method of using an injection molding process for both optical coupling elements and solder electrical interconnects, the method comprising:
    injection molding an array of microlenses in a first mold;
    transferring the array of microlenses onto a semiconductor wafer, each of the microlenses comprising optical polymers or glasses including a color absorbing filter integrated into the optical polymers or glasses of the each molded microlens to form a spectrally absorptive microlens,
    aligning a second mold to said wafer, said second mold including a set of solder openings for conducting molten solder through the second mold;
    placing said second mold in close contact with the wafer;
    injecting molten solder through the set of solder openings and onto the semiconductor wafer to form electrical interconnects on the wafer;
    removing the second mold from the wafer, leaving said electrical interconnects on the wafer for making connections with circuit elements.

2. The method according to claim 1, wherein the second mold includes a set of microlens openings to facilitate placing the second mold in close contact with the wafer without contacting the microlenses.

3. The method according to claim 2, wherein the placing said second mold in close contact with the wafer includes placing the second mold over the wafer with the microlenses positioned in the microlens openings of the second mold.

4. The method according to claim 3, wherein the microlens openings of the second mold are larger than the microlenses.

5. The method according to claim 1, wherein the solder openings of the second mold are cylindrical through-holes.

6. The method according to claim 1, wherein each of the microlenses transmits only a selected color of light.

7. The method according to claim 1, wherein the semiconductor wafer includes a plurality of semiconductor devices, and the microlenses are aligned with respect to the substrate to couple radiant energy to the plurality of semiconductor devices.

8. The method according to claim 7, wherein each of the microlenses has a radius of curvature and a focal length for semiconductor color imaging with said plurality of said semiconductor devices.

9. The method according to claim 1 wherein said microlenses are less than 10 micrometers in one dimension.

10. The apparatus of claim 1 wherein said microlenses are less than 1 micrometer in one dimension.

* * * * *

UNITED STATES PATENT AND TRADEMARK OFFICE
CERTIFICATE OF CORRECTION

PATENT NO. : 10,490,594 B2  
APPLICATION NO. : 15/294283  
DATED : November 26, 2019  
INVENTOR(S) : Lawrence Jacobowitz et al.

Page 1 of 1

It is certified that error appears in the above-identified patent and that said Letters Patent is hereby corrected as shown below:

On the Title Page

Item (12) "Jacobwitz" should read -- Jacobowitz et al. --.

(72) Inventors: should read as follows:  
Lawrence Jacobowitz, Wappingers Falls NY (US);  
Stephen Buchwalter, Hopewell Junction, NY (US);  
Casimer DeCusatis, Poughkeepsie, NY (US);  
Peter A. Gruber, Mohegan Lake NY (US);  
Da-Yuan Shih, Poughkeepsie, NY (US)

Signed and Sealed this  
Twenty-first Day of November, 2023

Katherine Kelly Vidal  
*Director of the United States Patent and Trademark Office*